(12) United States Patent
Jang et al.

(10) Patent No.: US 8,415,655 B2
(45) Date of Patent: Apr. 9, 2013

(54) SEMICONDUCTOR LIGHT EMITTING DEVICE

(75) Inventors: Jung Tae Jang, Gyeonggi-do (KR); Bun Hei Koo, Seoul (KR); Do Yeol Ahn, Seoul (KR); Seoung Hwan Park, Daegu (KR)

(73) Assignee: Wooree E&L Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/058,595

(22) PCT Filed: Aug. 12, 2009

(86) PCT No.: PCT/KR2009/004487
§ 371 (c)(1),
(2), (4) Date: Feb. 11, 2011

(87) PCT Pub. No.: WO2010/018985
PCT Pub. Date: Feb. 18, 2010

(65) Prior Publication Data
US 2011/0140079 A1   Jun. 16, 2011

(30) Foreign Application Priority Data

Aug. 12, 2008 (KR) ........................ 10-2008-0078838

(51) Int. Cl.
*H01L 33/06* (2010.01)
(52) U.S. Cl. ................. 257/13; 257/14; 257/15; 257/18; 257/E33.008
(58) Field of Classification Search ............... 257/13, 257/14, 15, 18, E33.008
See application file for complete search history.

(56) References Cited

U.S. PATENT DOCUMENTS

| 5,684,309 | A | * | 11/1997 | McIntosh et al. ............. 257/191 |
| 6,586,762 | B2 | | 7/2003 | Kozaki |
| 6,657,234 | B1 | | 12/2003 | Tanizawa |
| 6,838,693 | B2 | | 1/2005 | Kozaki |
| 6,906,352 | B2 | * | 6/2005 | Edmond et al. ................. 257/94 |
| 2004/0155248 | A1 | | 8/2004 | Fukuda et al. |
| 2009/0146160 | A1 | | 6/2009 | Nakahara |

FOREIGN PATENT DOCUMENTS

| JP | 2003-115610 | 4/2003 |
| JP | 2007-157766 | 6/2007 |
| JP | 2008-066555 | 3/2008 |

* cited by examiner

*Primary Examiner* — Thinh T Nguyen
(74) *Attorney, Agent, or Firm* — Harness, Dickey & Pierce, P.L.C.

(57) ABSTRACT

The present disclosure relates to a semiconductor light-emitting device which includes: a light-emitting layer composed of an active layer and of barrier layers formed as superlattice layers and disposed on and under the active layer to relieve stresses applied to the active layer and reduce the sum of electric fields generated in the active layer by the spontaneous polarization and the piezoelectric effect; an N-type contact layer injecting electrons into the light-emitting layer; and a P-type contact layer disposed opposite to the N-type contact layer with respect to the light-emitting layer and injecting holes into the light-emitting layer, wherein the active layer contains InGaN, and the barrier layers are formed by alternately stacking of an AlGaN thin film and an InGaN thin film.

18 Claims, 3 Drawing Sheets

SEMICONDUCTOR LIGHT EMITTING DEVICE

CROSS-REFERENCE TO RELATED APPLICATIONS

This application is a U.S. national stage filing under 35 U.S.C. §371 of International Application No. PCT/KR2009/004487 filed Aug. 12, 2009, and claims priority to Korean Application No. 10-2008-0078838 filed Aug. 12, 2008. The disclosures of the aforementioned applications are incorporated herein by reference in their entireties.

1. Technical Field

The present invention relates to a semiconductor light-emitting device, and more particularly, to a semiconductor light-emitting device which reduces an internal electric field to improve light-emitting efficiency Here, the semiconductor light-emitting device indicates a semiconductor light-emitting device which generates light by recombination of electrons and holes, and its example is a III-nitride semiconductor light-emitting device. The III-nitride semiconductor is made of a compound containing $Al(x)Ga(y)In(1-x-y)N$ ($0 \leq x \leq 1$, $0 \leq y \leq 1$, $0 \leq x+y \leq 1$). Another example is a GaAs semiconductor light-emitting device used for red emission.

2. Background Art

This section provides background information related to the present disclosure which is not necessarily prior art.

It has been known that III-V nitride and II-VI compound semiconductor structures, which constitute blue-violet and blue-green semiconductor light-emitting devices, significantly deteriorate a light-emitting characteristic which is one of the essential characteristics due to the piezoelectric field and spontaneous polarization caused by the attractive forces applied to an active layer, as compared with the other III-V semiconductor structures [Park et al., Appl. Phys. Lett. 75, 1354 (1999)].

In particularly, a method of changing a growth direction of a substrate to use a non-polar or semi-polar substrate has been known as an only method of removing the spontaneous polarization [Park & Chuang, Phys. Rev. B59, 4725 (1999) and Waltereit et al., Nature 406, 865 (2000)].

There have been many attempts to minimize the piezoelectric effect and the spontaneous polarization which are intrinsic vulnerabilities of the III-V nitride semiconductor. The representative methods include 1) a method of minimizing the spontaneous polarization and the piezoelectric effect by using a non-polar or semi-polar substrate [Park et al., Phys. Rev. B59, 4725(1999) and Waltereit et al., Nature 406, 865(2000)] and 2) a method of enhancing a transmitter confinement effect by forming a clad layer with a quaternary film and by increasing a composition ratio of double Al so as to improve light-emitting efficiency [Zhang et al., Appl. Phys. Lett. 77, 2668 (2000) and Lai et al., IEEE Photonics Technol. Lett. 13, 559 (2001)].

The first method generates a lot of defects during the manufacture of the device due to less-advanced growth techniques for a hetero crystal growth direction, which makes it difficult to obtain as good device characteristics as expected. Additionally, it complicates the manufacturing process [K. Nishizuka et al., Appl. Phys. Lett. 87, 231901 (2005)].

The second method cannot be a fundamental solution because it cannot basically eliminate the spontaneous polarization and the piezoelectric effect. However, according to the recent research results [Ahn et al., IEEE J. Quantum Electron. 41, 1253(2005)], if a quaternary-film barrier is used, it serves to improve an optical gain by the transmitter confinement effect of a quantum well.

Further, 3) a method of significantly improving a light-emitting characteristic of optical devices such as quantum-well LEDs and LDs has been suggested on the basis of a theoretical research that, when a composition ratio of In in a quantum well is determined in an InGaN/InGaAlN quantum-well structure having a quaternary-film barrier, a composition ratio of a quaternary film for eliminating an internal electric field generated by the piezoelectric effect and spontaneous polarization can be obtained [S. H. Park, D. Ahn, J. W. Kim, App. Phys. Lett. 92, 171115(2008)]. However, this method has a disadvantage in that the growth conditions of the quaternary-film barrier are extremely complicated.

DISCLOSURE

Technical Problem

The problems to be solved by the present disclosure will be described in the latter part of the best mode for carrying out the invention.

Technical Solution

This section provides a general summary of the disclosure and is not a comprehensive disclosure of its full scope or all of its features.

According to one aspect of the present disclosure, there is provided a semiconductor light-emitting device which includes: a light-emitting layer composed of an active layer and of barrier layers formed as superlattice layers and disposed on and under the active layer to relieve stresses applied to the active layer and reduce the sum of electric fields generated in the active layer by the spontaneous polarization and the piezoelectric effect; an N-type contact layer injecting electrons into the light-emitting layer; and a P-type contact layer disposed opposite to the N-type contact layer with respect to the light-emitting layer and injecting holes into the light-emitting layer, wherein the active layer contains InGaN, and the barrier layers are formed by alternately stacking of an AlGaN thin film and an InGaN thin film.

Advantageous Effects

The advantageous effects of the present disclosure will be described in the latter part of the best mode for carrying out the invention.

BEST MODE FOR CARRYING OUT THE INVENTION

The present disclosure will now be described in detail with reference to the accompanying drawings.

Figure 1:
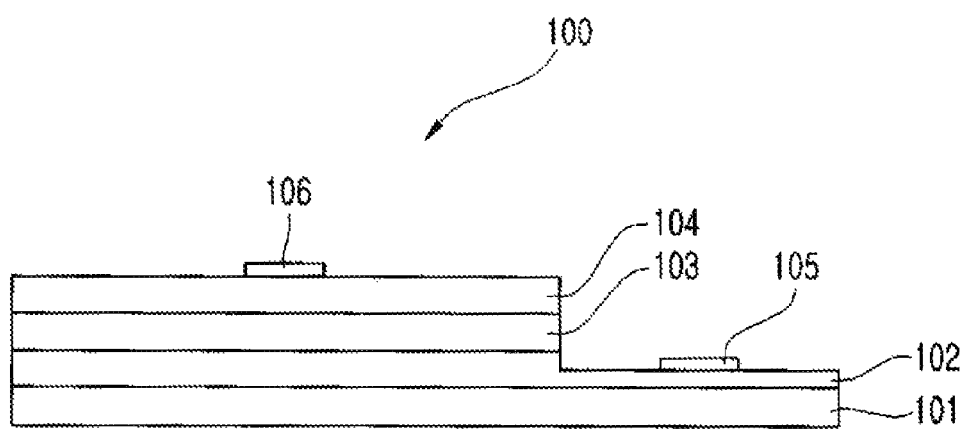
FIG. 1 is a schematic sectional view of a semiconductor light-emitting device according to an exemplary embodiment of the present invention.
Figure 2:
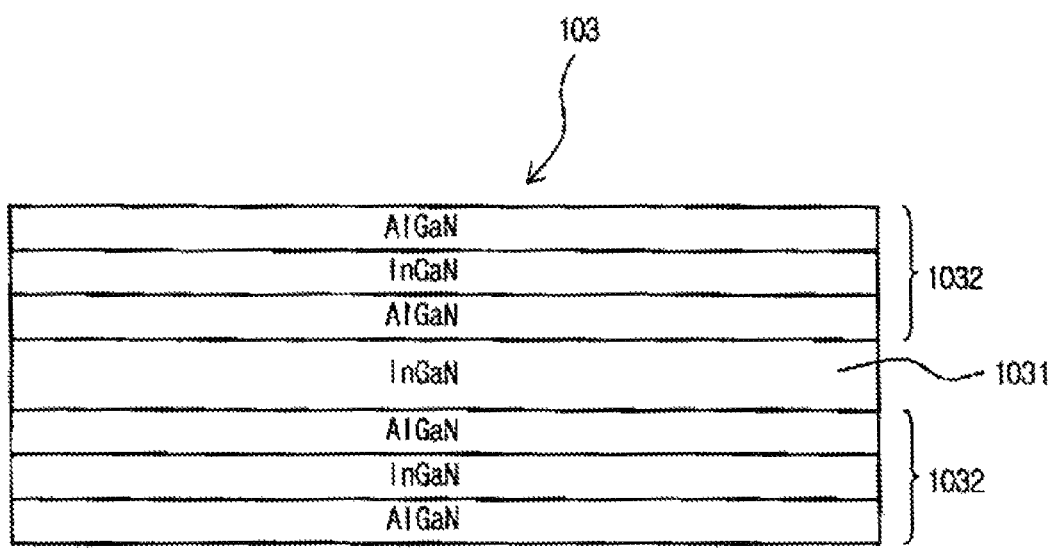
FIG. 2 is a sectional view of a light-emitting layer shown in FIG. 1.

FIG. 1 is a schematic sectional view of a semiconductor light-emitting device according to an exemplary embodiment of the present invention, and FIG. 2 is a sectional view of a light-emitting layer shown in FIG. 1.

Referring to FIGS. 1 and 2, the semiconductor light-emitting device 100 according to the exemplary embodiment of the present invention includes an N-type contact layer 102, a light-emitting layer 103, and a P-type contact layer 104.

The N-type contact layer 102 may be formed on a substrate 101. For example, the substrate 101 may be an $Al_2O_3$ substrate or an SIC substrate. Optionally, a buffer layer (not shown) may be further formed between the substrate 101 and the N-type contact layer 102. The buffer layer is provided for facilitating the high-quality nitride crystal growth.

For example, the N-type contact layer 102 may be provided as one or more nitride semiconductor layers. The N-type contact layer 102 injects electrons into the light-emitting layer 103.

The P-type contact layer 104 is disposed opposite to the N-type contact layer 102 with the light-emitting layer 103 therebetween. The P-type contact layer 104 may also be provided as one or more nitride semiconductor layers. The P-type contact layer 104 injects holes into the light-emitting layer 103.

When potentials are applied to a P-type electrode 106 and an N-type electrode 105, the N-type contact layer 102 injects electrons into the light-emitting layer 103 and the P-type contact layer 104 injects holes into the light-emitting layer 103, so that the electrons and holes are combined in the light-emitting layer 103. The resultant energy is converted into light energy.

The light-emitting layer 103 includes an active layer 1031 and barrier layers 1032. The active layer 1031 contains InGaN, and the barrier layers 1032 are formed as superlattice layers by alternately stacking an AlGaN thin film and an InGaN thin film.

The barrier layers 1032 formed as the superlattice layers serve to reduce an electric field in a quantum-well structure to improve an optical gain.

When the multilayered thin film is provided, the stains applied to each layer can be mathematically interpreted. If 1, 2, . . . , n layers each having a thickness of d1, d2, . . . , dn are sequentially stacked, the strain applied to the $i^{th}$ layer is represented by the following Formula 1 according to Nakajima's mathematical method [Nakajima, J. Appl. Phys. 72, 5213 (1992)]:

$$\sum_i M_i + \sum_i F_i \left( \sum_{j<i} d_j \right) = 0, \quad M_i = \frac{E_i d_i^2}{12R} \qquad \text{Formula 1}$$

wherein Fi denotes a force per unit length, Mi denotes a moment, ai denotes a lattice constant, Ei denotes a Young's modulus, and R denotes a curvature of the substrate.

Here, the conditions for maintaining the $i^{th}$ layer and the $(i+1)^{th}$ layer in the equilibrium state are represented by the following Formula 2:

$$l_i = a_i(1 + a_i T) \qquad \text{Formula 2}$$
$$l_{i+1}[1 + e_{i+1}(F_{i+1}) - e_{i+1}(M_{i+1})] = l_i[1 + e_i(F_i) + e_i(M_i)]$$
$$e_i(F_i) = \frac{F_i}{E_i d_i}$$

$$e_i(M_i) = \frac{d_i}{2R}$$

wherein $l_i$ denotes an effective lattice constant of the $i^{th}$ layer in consideration of thermal expansion, $\alpha_i$ denotes a thermal expansion coefficient of the $i^{th}$ layer, T denotes a temperature of the lattice, and $e_i$ denotes the strain applied to the $i^{th}$ layer.

The strain applied to the $i^{th}$ layer can be represented by the following Formula 3 through the combination of Formulae 1 and 2:

$$\varepsilon_{xxi} = \frac{F_i}{E_i d_i} + \frac{d_i}{2R} \qquad \text{Formula 3}$$

wherein, the force $F_i$ per unit length is represented by the following Formula 4:

$$F_i = \frac{E_i d_i}{\alpha_i \sum (E_j d_j / \alpha_j)} \times \Bigg[ \qquad \text{Formula 4}$$

$$\frac{1}{R} \sum_j \left( \frac{E_j d_j}{\alpha_j} \right) \left\{ \sum_{k<i} \alpha_k d_k - \sum_{k<j} \alpha_k d_k + \frac{\alpha_i d_i - \alpha_j d_j}{2} \right\} +$$

$$\sum_j \left( \frac{E_j d_j}{\alpha_j} \right) (l_j - l_i) \Bigg]$$

Meanwhile, the curvature of the entire multilayered thin film is represented by the following Formula 5:

$$\frac{1}{R} = \frac{R_3}{R_1 + R_2} \qquad \text{Formula 5}$$

$$R_1 = \left( \sum_i E_i d_i^3 \right) \left( \sum_1 \frac{E_1 d_1}{\alpha_1} \right)$$

$$R_2 = 3 \sum_i \frac{E_i d_i}{\alpha_i} \left( d_i + 2 \sum_{j<i} d_j \right) \times \Bigg[$$

$$\sum_j \left( \frac{E_j d_j}{\alpha_j} \right) \left\{ 2 \sum_{k<i} \alpha_k d_k - 2 \sum_{k<j} \alpha_k d_k + \alpha_i d_i - \alpha_j d_j \right\} \Bigg]$$

$$R_3 = 6 \sum_i \frac{E_i d_i}{\alpha_i} \left( d_i + 2 \sum_{j<i} d_j \right) \left( \sum_j \frac{E_j d_j}{\alpha_j} (l_i - l_j) \right)$$

The piezoelectric effect and the spontaneous polarization applied to the respective layers are represented by the following Formulae 6 and 7 by using the strain calculated as above:

$$P_{zi} = 2d_{31} \left( c_{11} + c_{12} - \frac{2c_{13}^2}{c_{33}} \right) \varepsilon_{xxi} \qquad \text{Formula 6}$$

wherein $\varepsilon xxi$ denotes the value of Formula 3, and C11, C12, C13, and C33 denote stiffness constants.

$$E_i = \frac{\sum_k d_k P_{ik}/\varepsilon_k - P_{zi}\sum_k d_k/\varepsilon_k}{\varepsilon_i \sum_k d_k/\varepsilon_k} \quad \text{Formula 7}$$

The preferable multilayered structure calculated using the above formulae is as follows.

That is, the active layer 1031 has a thickness of e.g. 2 nm to 3.5 nm.

Preferably, the AlGaN thin film and the InGaN thin film, which constitute the superlattice layer of the barrier layer 1032, have such a thickness that the electrons are not confined by the superlattice layer.

That is, the thickness of each of the AlGaN thin film and the InGaN thin film is 2 nm or less. For example, the thickness of each of the AlGaN thin film and the InGaN thin film ranges from 1 nm to 2 nm and is about 1.5 nm in this embodiment.

If a composition ratio of In to Ga in the active layer 1031 is 0.15 to 0.85, a composition ratio of Al to Ga in the AlGaN thin film of the barrier layer 1032 is 0.2 to 0.8, and a composition ratio of In to Ga in the InGaN thin film of the barrier layer 1032 is 0.2 to 0.8, the electric field and the strain applied to the quantum well are calculated as in the following Table 1:

TABLE 1

| | Conventional GaN barrier layer | Inventive AlGaN/InGaN superlattice barrier layer |
|---|---|---|
| Strain (%) in active layer | −1.607 | −1.435 |
| Electric field (MV/cm) in active layer | 2.432 | 2.346 |

As seen in Table 1, the inventive AlGaN/InGaN superlattice barrier layer 1032 more reduced both the strain and the electric field in the active layer 1031 than the conventional GaN barrier layer.

If there is an electric field in the active layer, the electrons and holes receive forces in opposite directions and thus become distant from each other. Therefore, there is less possibility that the electron and hole pairs can be combined to generate photons.

On the contrary, according to the present invention, since the electric field in the active layer 1031 is reduced, there is more possibility that the electron and hole pairs can be combined to improve light-emitting efficiency.

Figure 3:
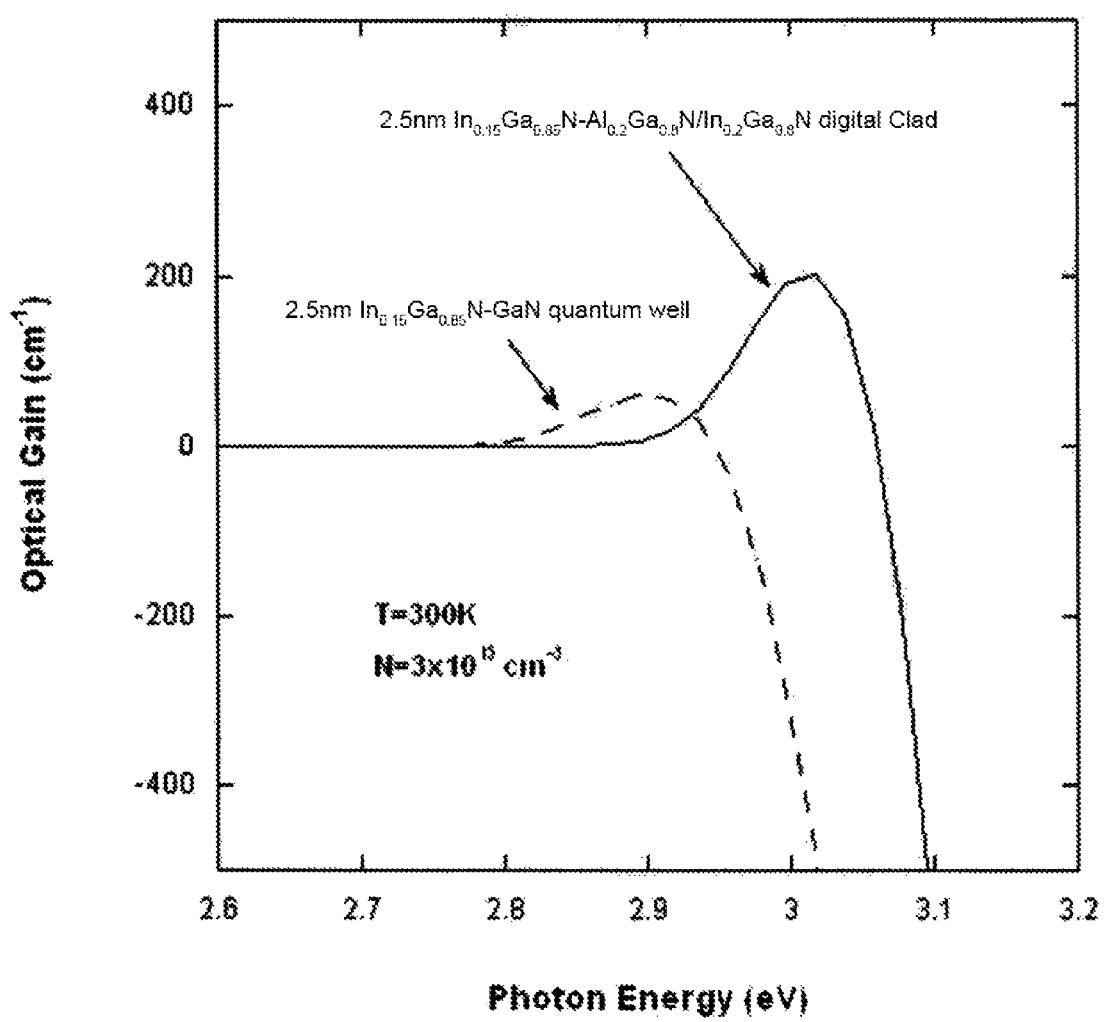
FIG. 3 is a graph showing optical gains of a conventional semiconductor light-emitting device and optical gains of the semiconductor light-emitting device shown in FIG. 1.

Here, the optical gains are as shown in FIG. 3

In the meantime, the optical gain spectrum is calculated using the non-Markovian gain model with many-body effects (See S. H. Park, S. L. Chung, and D. Ahn, "Interband relaxation time effects on non-Markovian gain with many-body effects and comparison with experiment", Semicond. Sci. Technol., vol. 15 pp. 2003-2008).

The optical gain having the many-body effects including the anisotropic effect of the valence-band dispersion is represented by the following Formula 8:

$$g(\omega) = \quad \text{Formula 8}$$

$$\sqrt{\frac{\mu_0}{\varepsilon}}\,2\!\left(\frac{e^2}{m_0^2\omega}\right)\!\int_0^{2\pi}\!d\phi_0\!\int_0^\infty dk_\| \frac{2k_\|}{(2\pi)^2 L_\omega}\cdot|M_{nm}(k_\|,\phi_0)|^2$$

$$[f_n^c(k_\|,\phi_0) - f_m^v(k_\|,\phi_0)]L(\omega,k_\|,\phi_0)$$

wherein $\omega$ denotes an angular velocity, $\mu 0$ denotes a permeability in the vacuum, $\epsilon$ denotes a dielectric constant, $\sigma = U$ (or L) denotes an effective mass Hamiltonian upper (or lower) block, e denotes a quantity of electric charge of electrons, m0 denotes a mass of free electrons, $k_\|$ denotes a magnitude of a surface wave vector on a quantum-well plane, Lw denotes a width of the well, and $|M_{lm}|^2$ denotes a matrix component of the strained quantum well. In addition, $f_1^c$ and $f_M^v$ denote Fermi functions for occupation probability by electrons in the conduction band and the valence band, respectively. Subscripts l and m represent an electrode state and a hole state in the conduction band, respectively.

Moreover, the re-normalized transition energy between the electrons and the holes is represented by the following Formula 9:

$$E_{lm}(k_\|, h\omega, \Phi_0) = E_l^c(k_\|, \Phi_0) - E_m^v(k_\|, \Phi_0) + E_g + \Delta E_{SX} + \Delta E_{CH}F - h\omega \quad \text{Formula 9}$$

wherein Eg denotes a bandgap, and $\Delta$ESX and $\Delta$ECH denote screened exchange and Coulomb-hole contribution for the bandgap re-normalization, respectively (See W. W. Chow, M. Hagerott, A. Bimdt, and S. W. Koch, "Threshold conditions for an ultraviolet wavelength GaN quantum-well laser", IEEE J. Select. Topics Quantum Electron., vol. 4, pp. 514-519, 1998).

The Gaussian line shape function $L(\omega, k_\|, \phi)$ is represented by the following Formula 10:

$$L(\omega, k_\|, \Phi_0) = \frac{(1 - \mathrm{Re}Q(k_\|, h\omega, \Phi_0))\mathrm{Re}L(E_{lm}(k_\|, h\omega, \Phi_0)) - \mathrm{Im}Q(k_\|, h\omega, \Phi_0)\mathrm{Im}L(E_{lm}(k_\|, h\omega, \Phi_0))}{(1 - \mathrm{Re}Q(k_\|, h\omega, \Phi_0))^2 + (\mathrm{Im}Q(k_\|, h\omega, \Phi_0))^2 C} \quad \text{Formula 10}$$

wherein $Q(k_\|, h_\omega, \phi_0)$ causes a Coulomb rise in the exitonic or interband transition. The above line shape function is the most simple Gaussian of the non-Markovian quantum kinetics and is represented by the following Formulae 11 and 12:

$$\mathrm{Re}[L(E_{lm}(k_\|, h\omega, \Phi_0))] = \sqrt{\frac{\pi\tau_{in}(k_\|, h\omega, \Phi_0)\tau_c}{2h^2}} \quad \text{Formula 11}$$

$$\exp\!\left(-\frac{\tau_{in}(k_\|, h\omega, \Phi_0)\tau_c}{2h^2}E_{lm}^2(k_\|, h\omega, \Phi_0)\right)$$

$$\mathrm{Im}[L(E_{lm}(k_\|, h\omega, \Phi_0))] = \quad \text{Formula 12}$$

$$\frac{\tau_c}{h}\int_0^\infty \exp\!\left(-\frac{\tau_c}{2\tau_{in}(k_\|, h\omega, \Phi_0)}t^2\right)\sin\!\left(\frac{\tau_c E_{lm}(k_\|, h\omega, \Phi_0)}{h}t\right)dt$$

The interband relaxation time τin and the correlation time τc are considered as constants and calculated as 25 fs and 10 fs, respectively.

FIG. 3 is a graph showing the optical gains of the conventional semiconductor light-emitting device and the optical gains of the semiconductor light-emitting device shown in FIG. 1. The graph of FIG. 3 was obtained through the numerical calculations using Formula 8.

Referring to FIG. 3, in the semiconductor light-emitting device having the AlGaN/InGaN superlattice barrier according to the present invention, as the electric field decreases, the maximum value of the optical gain increases from 60.4 cm to 202.9 cm. Additionally, the semiconductor light-emitting device having the AlGaN/InGaN superlattice barrier according to the present invention shows the blue shift phenomenon which shifts the wavelength to the blue light.

Hereinafter, various exemplary embodiments of the present disclosure will be described.

(1) A semiconductor light-emitting device, wherein the thickness of each of the AlGaN thin film and the InGaN thin film ranges from 1 nm to 2 nm.

(3) A semiconductor light-emitting device, wherein the thickness of each of the AlGaN thin film and the InGaN thin film is 1.5 nm.

(4) A semiconductor light-emitting device, wherein the AlGaN thin film and the InGaN thin film are symmetric about the active layer.

(5) A semiconductor light-emitting device, wherein the thickness of the active layer ranges from 2 nm to 3.5 nm.

(6) A semiconductor light-emitting device, wherein a composition ratio of In to GA in the active layer is smaller than a composition ratio of In to Ga in the InGaN thin film of the barrier layer.

(7) A semiconductor light-emitting device, wherein a composition ratio of In to GA in the active layer is 0.15 to 0.85, a composition ratio of In to Ga in the InGaN thin film of the barrier layer is 0.2 to 0.8, and a composition ratio of Al to Ga in the AlGaN thin film of the barrier layer is 0.2 to 0.8.

The semiconductor light-emitting device according to one aspect of the present disclosure can minimize the internal electric field generated by the piezoelectric effect and the spontaneous polarization, by using the tertiary-film superlattice barrier layers, instead of using the quaternary-film barrier layers difficult to grow, which results in high light-emitting efficiency.

The invention claimed is:

1. A semiconductor light-emitting device, comprising:
   a light-emitting layer composed of an active layer and of barrier layers formed as superlattice layers and disposed on and under the active layer to relieve stresses applied to the active layer and reduce the sum of electric fields generated in the active layer by the spontaneous polarization and the piezoelectric effect;
   an N-type contact layer injecting electrons into the light-emitting layer; and
   a P-type contact layer disposed opposite to the N-type contact layer with respect to the light-emitting layer and injecting holes into the light-emitting layer,
   wherein the active layer contains InGaN, and the barrier layers are formed by alternately stacking of an AlGaN thin film and an InGaN thin film.

2. The semiconductor light-emitting device of claim 1, wherein the AlGaN thin film and the InGaN thin film have such a thickness that the electrons are not confined by the barrier layer.

3. The semiconductor light-emitting device of claim 1, wherein the thickness of each of the AlGaN thin film and the InGaN thin film ranges from 1 nm to 2 nm.

4. The semiconductor light-emitting device of claim 1, wherein a composition ratio of In to GA in the active layer is smaller than a composition ratio of In to Ga in the InGaN thin film of the barrier layer.

5. The semiconductor light-emitting device of claim 3, wherein a composition ratio of In to GA in the active layer is smaller than a composition ratio of In to Ga in the InGaN thin film of the barrier layer.

6. The semiconductor light-emitting device of claim 1, wherein the thickness of the active layer ranges from 2 nm to 3.5 nm.

7. The semiconductor light-emitting device of claim 4, wherein the thickness of the active layer ranges from 2 nm to 3.5 nm.

8. The semiconductor light-emitting device of claim 5, wherein the thickness of the active layer ranges from 2 nm to 3.5 nm.

9. The semiconductor light-emitting device of claim 5, wherein a composition ratio of In to GA in the active layer is 0.15 to 0.85, and a composition ratio of In to Ga in the InGaN thin film of the barrier layer is 0.2 to 0.8.

10. The semiconductor light-emitting device of claim 9, wherein a composition ratio of Al to Ga in the AlGaN thin film of the barrier layer is 0.2 to 0.8.

11. The semiconductor light-emitting device of claim 1, wherein the AlGaN thin film and the InGaN thin film are symmetric about the active layer.

12. The semiconductor light-emitting device of claim 3, wherein the thickness of each of the AlGaN thin film and the InGaN thin film is 1.5 nm.

13. The semiconductor light-emitting device of claim 1, wherein the N-type contact layer and the P-type contact layer are made of a III-nitride semiconductor,
   the AlGaN thin film and the InGaN thin film are symmetric about the active layer,
   the thickness of the active layer ranges from 2 nm to 3.5 nm and the composition ratio of In to Ga is 0.15 to 0.85,
   the thickness of the InGaN thin film of the barrier layer is 1.5 nm and the composition ratio of In to Ga is 0.2 to 0.8, and
   the thickness of the AlGaN thin film of the barrier layer is 1.5 nm and the composition ratio of Al to Ga is 0.2 to 0.8.

14. The semiconductor light-emitting device of claim 4, wherein the AlGaN thin film and the InGaN thin film have such a thickness that the electrons are not confined by the barrier layer.

15. The semiconductor light-emitting device of claim 14, wherein the thickness of each of the AlGaN thin film and the InGaN thin film ranges from 1 nm to 2 nm.

16. The semiconductor light-emitting device of claim 4, wherein the alternative stacking is made by the AlGaN thin film, the InGaN thin film and the AlGaN thin film sequentially.

17. The semiconductor light-emitting device of claim 4, wherein the thickness of each of the AlGaN thin film and the InGaN thin film ranges from 1 nm to 2 nm.

18. The semiconductor light-emitting device of claim 16, wherein the thickness of each of the AlGaN thin film and the InGaN thin film ranges from 1 nm to 2 nm.

* * * * *